United States Patent
Rozen et al.

(10) Patent No.: US 7,999,581 B1
(45) Date of Patent: Aug. 16, 2011

(54) SYSTEM AND A METHOD FOR PROVIDING AN OUTPUT CLOCK SIGNAL

(75) Inventors: Anton Rozen, Gedera (IL); Michael Priel, Hertzlya (IL); Daphna Sharon-Zamsky, Ra'anana (IL)

(73) Assignee: Freescale Semiconductor, Inc., Austin, TX (US)

( * ) Notice: Subject to any disclaimer, the term of this patent is extended or adjusted under 35 U.S.C. 154(b) by 106 days.

(21) Appl. No.: 12/053,601

(22) Filed: Mar. 23, 2008

(51) Int. Cl.
  *H03K 21/00* (2006.01)
  *H03K 23/00* (2006.01)
  *H03K 25/00* (2006.01)
(52) U.S. Cl. ........................ 327/115; 327/291
(58) Field of Classification Search .................. 327/291, 327/115
See application file for complete search history.

(56) References Cited

U.S. PATENT DOCUMENTS

| | | |
|---|---|---|
| 6,445,228 B1 | 9/2002 | Nguyen |
| 6,483,888 B1 | 11/2002 | Boerstler et al. |
| 2003/0048118 A1 | 3/2003 | Nguyen et al. |
| 2003/0074595 A1 | 4/2003 | Brock et al. |
| 2005/0057285 A1 | 3/2005 | Austin et al. |
| 2006/0091928 A1* | 5/2006 | Kapur ........................ 327/298 |
| 2008/0211560 A1* | 9/2008 | Lam ............................ 327/291 |

* cited by examiner

*Primary Examiner* — Lincoln Donovan
*Assistant Examiner* — Daniel Rojas (57) ABSTRACT

A system for providing an output clock signal, the system includes: (a) a first clock divider, adapted to receive an input clock signal and to provide a first divider output clock signal having a frequency that is lower than a frequency of the input clock signal; and (b) a second clock divider, adapted to select a second divider input clock signal out of the input clock signal and the first divider output clock signal, and to provide the output clock signal having a frequency that is lower than the frequency of the second divider input clock signal.

15 Claims, 8 Drawing Sheets

SYSTEM AND A METHOD FOR PROVIDING AN OUTPUT CLOCK SIGNAL

BACKGROUND

1. Field

This disclosure relates generally to systems and methods for providing output clock signal, and more specifically, to systems and method for dividing clock signals in electronic circuits.

2. Related Art

In many electronic systems, a clock signal is used to synchronize the various circuits. In complex systems, multiple clock signals are used where, conveniently, one main (high frequency) clock signal is divided to clock signals of lower frequencies wherever needed. It is noted that the dividing of a clock signal is a common term for the processing a first clock signal of a first frequency, to provide a second clock signal of a second frequency lower than the first one, wherein the ratio between the two frequencies is a rational number, and conveniently a natural number. The dividing of clock signals to clock signals of lower frequencies is conveniently carried out by electronic components known a clock dividers, and complex systems usually include a large number of clock dividers.

The power consumption of each of these clock dividers is proportional to the frequency of the input (main) clock signal. In many devices the clock generator unit consumes a substantial portion of the power consumed by the whole device.

Figure 1:
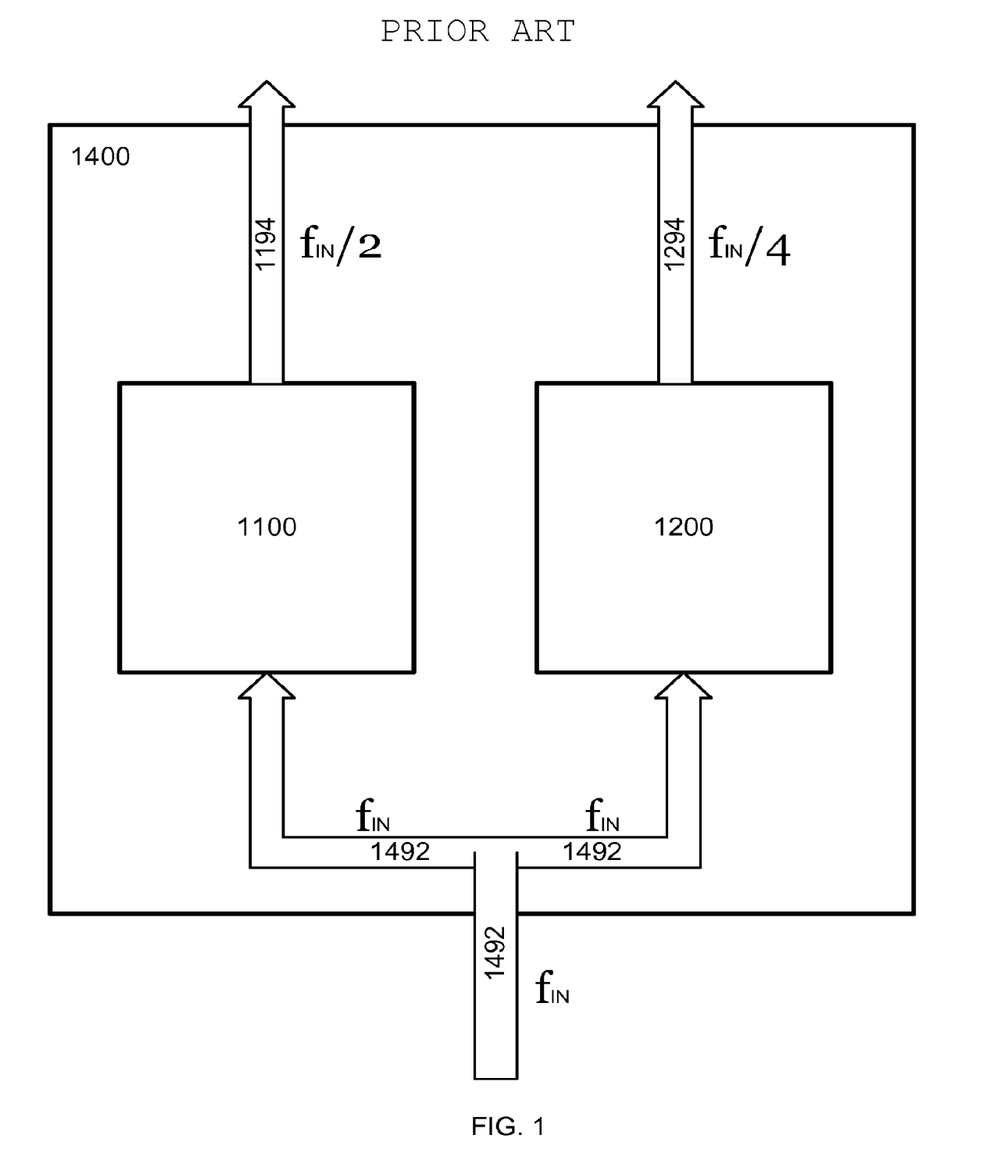
FIG. 1 is a block diagram of a prior art system for providing two output clock signals.

FIG. 1 is a block diagram of prior art system 1400 for providing two output clock signals, 1194 and 1294. Conveniently, prior art system 1400 is a part of an electronic system, and, is implemented on a semiconductor chip. Prior art system 1400 includes first clock divider 1100 that is adapted to receive input clock signal 1492, and to provide first divider output clock signal 1194 having a frequency that is lower than a frequency of input clock signal 1492 (in the example illustrated, a having frequency which is half the frequency of input clock signal 1492); and second clock divider 1200, adapted to provide second divider output clock signal 1294 having a frequency that is lower than the frequency of input clock signal 1492 (in the example illustrated, a having frequency which is one quarter of the frequency of input clock signal 1492). It is noted that first clock divider 1100 may be similar to second clock divider 1200.

It is clear to a person who is skilled in the art that the power consumption of second clock divider 1200 is relatively high, as it receives as input a clock signal having a frequency that is four times the frequency of the required second divider output clock signal 1294, while a clock signal having a frequency which is only twice as much is available in prior art system 1400 (i.e. first divider output clock signal 1194).

There is a growing need to reduce the power consumption of a clock generation unit. Such power reduction can reduce the heating of a system and can lengthen the duration between battery replacement or battery recharging operations.

SUMMARY OF THE INVENTION

A system for providing an output clock signal, the system includes: (a) a first clock divider, adapted to receive an input clock signal and to provide a first divider output clock signal having a frequency that is lower than a frequency of the input clock signal; and (b) a second clock divider, adapted to select a second divider input clock signal out of the input clock signal and the first divider output clock signal, and to provide the output clock signal having a frequency that is lower than the frequency of the second divider input clock signal.

A method for providing an output clock signal, the method includes: (a) receiving, by a first clock divider, an input clock signal; (b) providing, by the first clock divider, a first divider output clock signal having a frequency that is lower than a frequency of the input clock signal; (c) selecting, by a second clock divider, a second divider input clock signal out of the input clock signal and the first divider output clock signal; and (d) providing, by the second clock divider, the output clock signal having a frequency that is lower than the frequency of the second divider input clock signal.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The term "coupled," as used herein, is not intended to be limited to a direct coupling or a mechanical coupling.

Furthermore, the terms "a" or "an," as used herein, are defined as one as or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Figure 2:
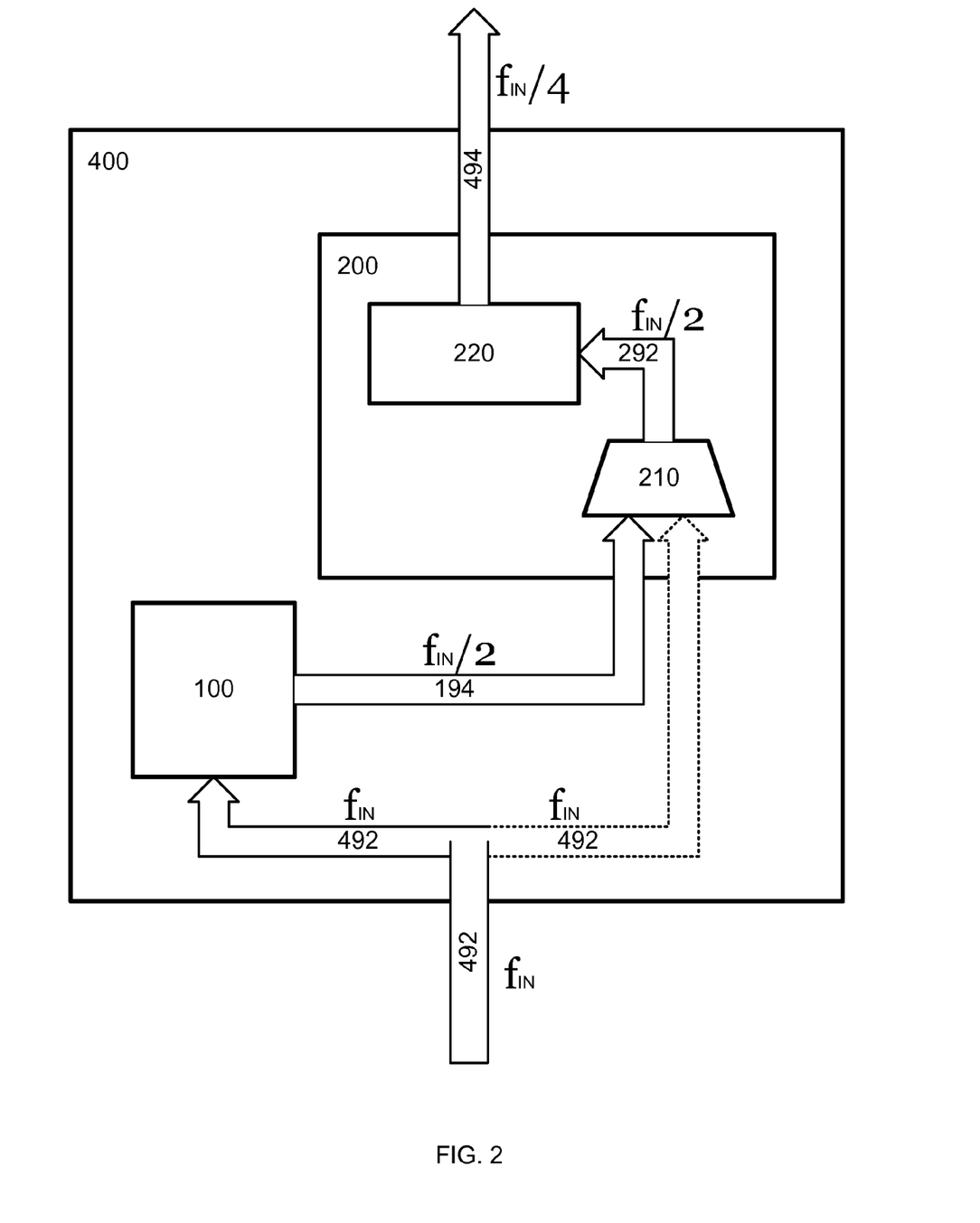
FIG. 2 is a block diagram of an embodiment of a system for providing an output clock signal.

FIG. 2 is a block diagram of system 400 for providing output clock signal 494. System 400 is a part of an electronic system, and, according to an embodiment of the invention, is implemented on a semiconductor chip. It is noted that conveniently, different embodiments of system 400 are adapted to carry out different embodiments of method 600 that is described below.

System 400 includes first clock divider 100 that is adapted to receive input clock signal 492, and to provide first divider output clock signal 194 having a frequency that is lower than a frequency of input clock signal 492; and second clock divider 200, adapted to select second divider input clock signal 292 out of input clock signal 492 and first divider output clock signal 194, and to provide output clock signal 494 having a frequency that is lower than the frequency of second divider input clock signal 292. It is noted that first clock divider 100 may be similar to second clock divider 200 (embodiments of which are detailed below) or different from which.

It is noted that second clock divider is conveniently adapted to provide output clock signal 494 having a frequency that substantially equals to the frequency of second divider input clock signal 292, if so required.

Conveniently, first clock divider 100 is further adapted to receive a first divider requested output frequency (i.e. a matching control signal) which indicates the required frequency of first divider output clock signal 194. It is noted that, According to an embodiment of the invention, first clock divider receives a first divider division ratio indication, which specifies the required first divider division ratio.

It is noted that second clock divider 200 can include second divider clock division logic 220, which is adapted to divide second divider input clock signal 292 to provide output clock signal 494. Conveniently, second clock divider 200 further includes multiplexer 210 that is adapted to receive both of input clock signal 492 and first divider output clock signal 194, and to provide to second divider clock division logic 220 the selected second divider input clock signal 292.

In the example illustrated in FIG. 2, the frequency of input clock signal 492 is denoted as $f_{IN}$. In the illustrated example, first clock divider 100 divides input clock signal 492 to provide first divider output clock signal 192, the frequency of which is half of the frequency of input clock signal 492 (denoted $f_{IN}/2$). Continuing the same example, second clock divider 200 is requested to provide output clock signal 494 having a required output frequency that is equal to one fourth of the frequency of input clock signal 492 (denoted $f_{IN}/4$).

Therefore, in the example offered, second clock divider 200 selects second divider input clock signal 292 out of the input clock signal 492, which has frequency of $f_{IN}$, and of first divider output clock signal 194, which has frequency of $f_{IN}/2$.

Conveniently, second clock divider 200 is adapted to select first divider output clock signal 194 for second divider input clock signal 292 if a ratio between frequency of first divider output clock signal 194 and the required output frequency of output clock signal 494 is a positive integer (or a multiplicative inverse thereof). According to an embodiment of the invention, first divider output clock signal 194 is selected by second clock divider 200 if said ratio is a power of 2.

It is noted that a division of a clock signal is relatively easily implemented if a ratio between an input clock signal of the division and an output clock signal thereof is a natural number, and especially, a power of 2, and that divisions of signals by powers of 2 are common in the art. Therefore, situation as described in the example is quite common. Returning now to the example offered above, as the ratio between the requested output frequency and between the frequency of first signal output clock signal 194 is 1 to 2, second clock divider 200 conveniently selects first divider output clock signal 194 for second divider input clock signal 292.

Multiplexer 210 which receives both input clock signal 492 and first divider output clock signal 194 provides—conveniently in response to selection indication 212—to second divider clock division logic 220 the selected second divider input clock signal 292, which is first divider output clock signal 194, and second divider clock division logic 220 divides second clock input clock signal 292 to provide output clock signal 494 of the frequency of $f_{IN}/4$. It is clear to any person who is skilled in the art that other frequencies of the different clock signals could be used, and that the above given values were merely example values which were used to clarify an aspect of the invention.

Figure 3:
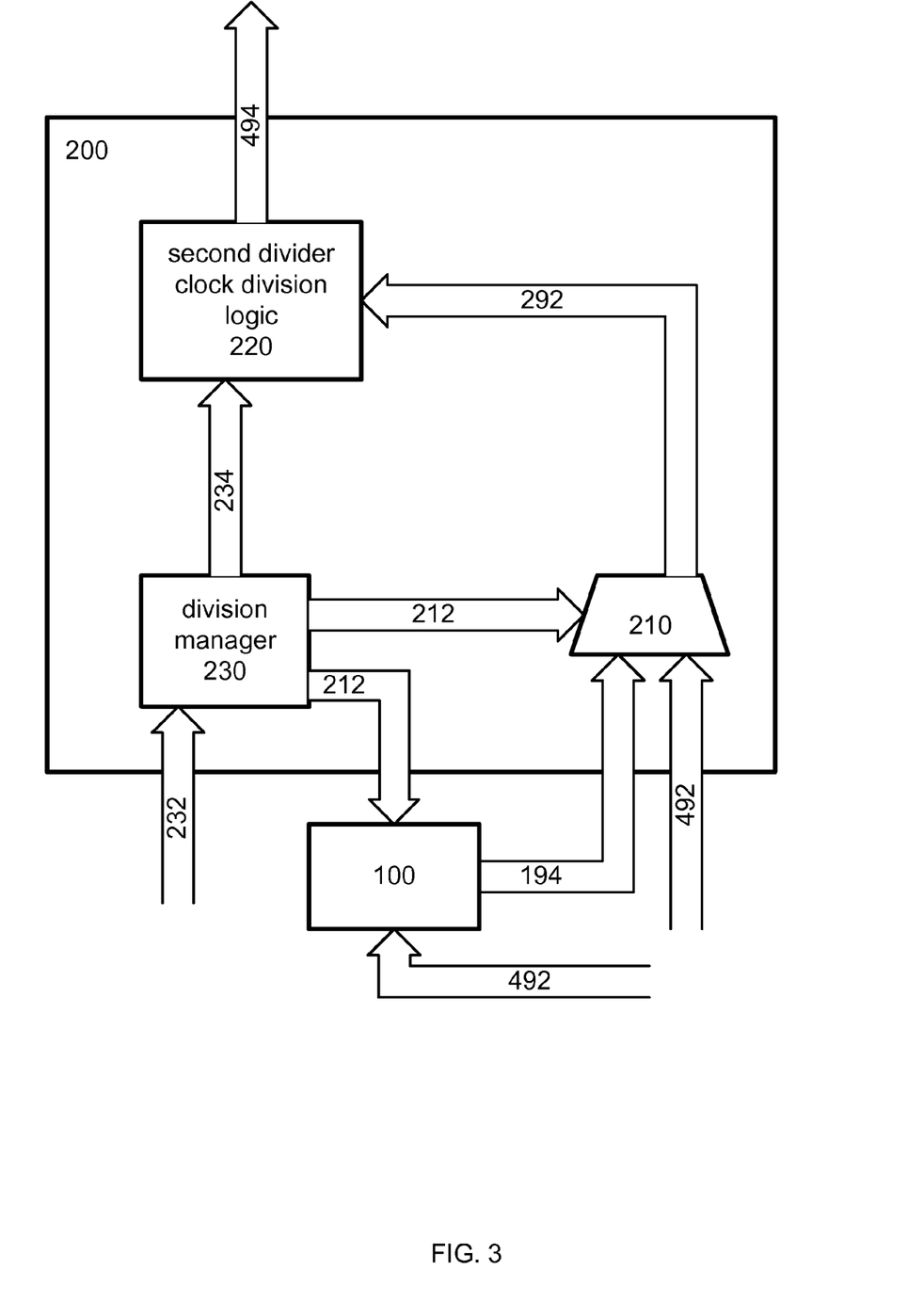
FIG. 3 is a block diagram of an embodiment of a second clock divider.

Referring to the example set forth in FIG. 3, conveniently, second clock divider 200 is adapted to receive required division factor 232 from an external component, which indicates to second clock divider 200 the ratio between the required output frequency and the input frequency of input clock signal 492. Conveniently, required division factor 232 is received by division manager 230, which conveniently includes a register for storing required division factor 232.

Conveniently, second clock divider 200 receives the required output frequency directly, but it is clear to any person who is skilled in the art that the two are equivalent. Similarly, according to an embodiment of the invention, the aforementioned selection is responsive to a ratio between requested division factor 232 and between a first divider division ratio that is used in the dividing of input clock signal 492 by first clock divider 100.

Conveniently, selection indication 212 is provided to multiplexer 210 by division manager 230. According to an embodiment of the invention, second clock divider 200 is adapted to indicate to first clock divider 100 if a provision of first divider output clock signal 194 is required. According to such an embodiment of the invention, second clock divider 200 is adapted to indicate to first clock divider 100 to provide first divider output clock signal 194 to second clock divider 200 only if first divider output clock signal 194 is selected for second divider input clock signal 292. According to an embodiment of the invention, said indication is selection indication 212 that is provided by division manager 230 to first clock divider 100.

It is noted that the operation of first clock divider 100 does not have to be dependent upon the indication received from second clock divider 200, and that first clock divider 100 can operate regardless of such indication.

Conveniently, second clock divider 200 is further adapted to determine second divider division factor 234 in response to the selection of second divider input clock signal 292. Conveniently, a ratio between second divider division factor 234 and received division factor 232 sent to second clock divider 200 (conveniently by a system that requires output clock signal 494) equals a ratio between the frequency of first divider output clock signal 194 and the frequency of input clock signal 492. Conveniently, second clock divider 200 is adapted to determine second divider division factor 234 so that the ratio between second divider division factor 234 and received division factor 232 equals the ratio between the frequency of first divider output clock signal 194 and the frequency of input clock signal 492. Conveniently, the determining of second divider division factor 234 is carried out by division manager 230.

Returning to the example offered in relation to FIG. 2, the ratio between the frequencies of first divider output clock signal 194 and of input clock signal 492 is 1 to 2. Continuing the same example, received division factor 232 is 4 (so that the frequency of output clock signal 494 is $f_{IN}/4$), and therefore second clock divider 200 (and according to an aforementioned embodiment of the invention, division manager 230) is adapted to determine second divider division factor to 2, so that the ratio between the division factors 232 and 234 will also equal a 1 to 2 ratio, providing total division factor from input clock signal 492 to output clock signal 494 as ratio of 4 to 1.

Conveniently several components of second clock driver 200 are implemented in one or more processors (not shown) of second clock divider 200. Conveniently, such components are second divider clock division logic 220, division manager 230. IT is noted that, conveniently, one or more features of components of second clock divider 200 (such as second divider clock division logic 220, and division manager 230) are carried out by components of system 400 which are external to second clock divider 200.

Figure 4:
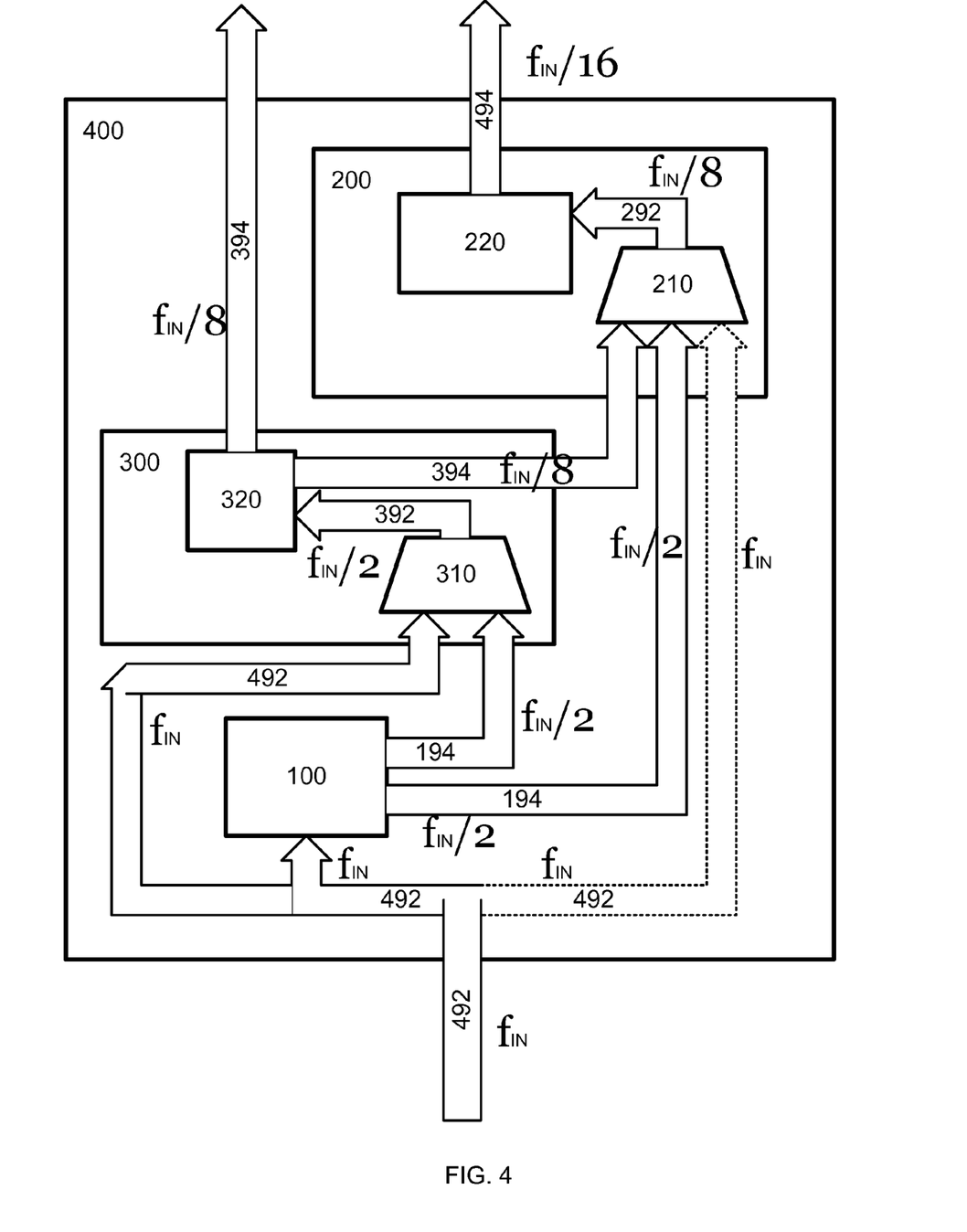
FIG. 4 is a block diagram of an embodiment of a system for providing an output clock signal.

FIG. 4 is a block diagram of system 400 for providing output clock signal 494. System 400 includes at least three clock dividers (illustrated are three clock dividers; first clock divider 100, second clock divider 200 and third clock divider 300, but additional clock dividers are part of system 400 according to different embodiments of the invention), wherein second clock divider 200 is adapted to select second divider input clock signal 292 out of input clock signal 492 and out of output clock signals outputted by another clock divider out of the at least three clock dividers (illustrated are first divider output clock signal 194 and third divider output clock signal 394).

Conveniently, system 400 includes third clock divider 300, third clock divider 300 is adapted to select third divider input clock signal 392 out of input clock signal 492 and first divider output clock signal 194, and to provide third divider output clock signal 394 having a frequency that is lower than the frequency of third divider input clock signal 392, and wherein second clock divider 200 is adapted to select second divider input clock signal 292 out of input clock signal 492, first divider output clock signal 194 and third divider output clock signal 394, and to provide output clock signal 494 having a frequency that is lower than the frequency of second divider input clock signal 292.

Conveniently, third clock divider 300 includes components similar to those of second clock divider 200, such as multiplexer 310 and third divider clock division logic 320, wherein components similar to those of different embodiments of second clock divider 200 are included in third clock divider 300 according to different embodiments of the invention.

In the example illustrated in FIG. 4, first clock divider 100 provides first divider output clock signal 194 of a frequency of $f_{IN}/2$, and third clock divider 300 provides third divider output clock signal 394 of a frequency of $f_{IN}/8$. The requested output frequency is $f_{IN}/16$, and second clock divider 200 selects to divide third divider output clock signal 394 to provide output clock signal 494, the frequency of which is $f_{IN}/16$.

It is noted that conveniently, at least some clock dividers of system 400 (such as second clock divider 200 in the given example) is adapted to select as an input clock signal the received signal with the lowest frequency which qualifies with selection rules which relate to ratios between the frequency of a requested output frequency requested from said clock divider and the frequencies of the multiple input clock signals received by said clock divider. It will be clear to a person who is skilled in the art that conveniently, such a selection facilitates lower power consumption by said clock divider, and thus by system 400 generally.

It is noted that, typically, power consumption reduction is achieved at least in two types of systems 400: (a) as is elaborately disclosed below, system 400 may include according to different embodiments of the invention multiple first clock dividers 100 and/or multiple second clock dividers 200, wherein power consumption reduction is conveniently achieved in systems 400 which includes more second clock dividers 200 than first clock dividers 100 (e.g. a single first clock divider 100 is serving multiple second clock dividers 200); (b) in systems 400 where first clock divider 100 is already incorporated in system 400, and second clock divider 200 is added on top of the already existing first clock divider 100, and uses the later so as to reduce power consumption of the subsequently added second clock divider 200. It is however clear to a person who is skilled in the art that power consumption reduction according to the teachings of the invention may be achieved in other architectures and situations but the two offered above.

It is noted that conveniently, output clock signals generated by clock dividers other than second clock divider 200 are provided to different systems or components thereof, which demands clock signals in different frequencies. In the example illustrated in FIG. 4, third divider output clock signal 394 is shown to be provided as an output clock signal other than the one provided by second clock divider 300.

Figure 5:
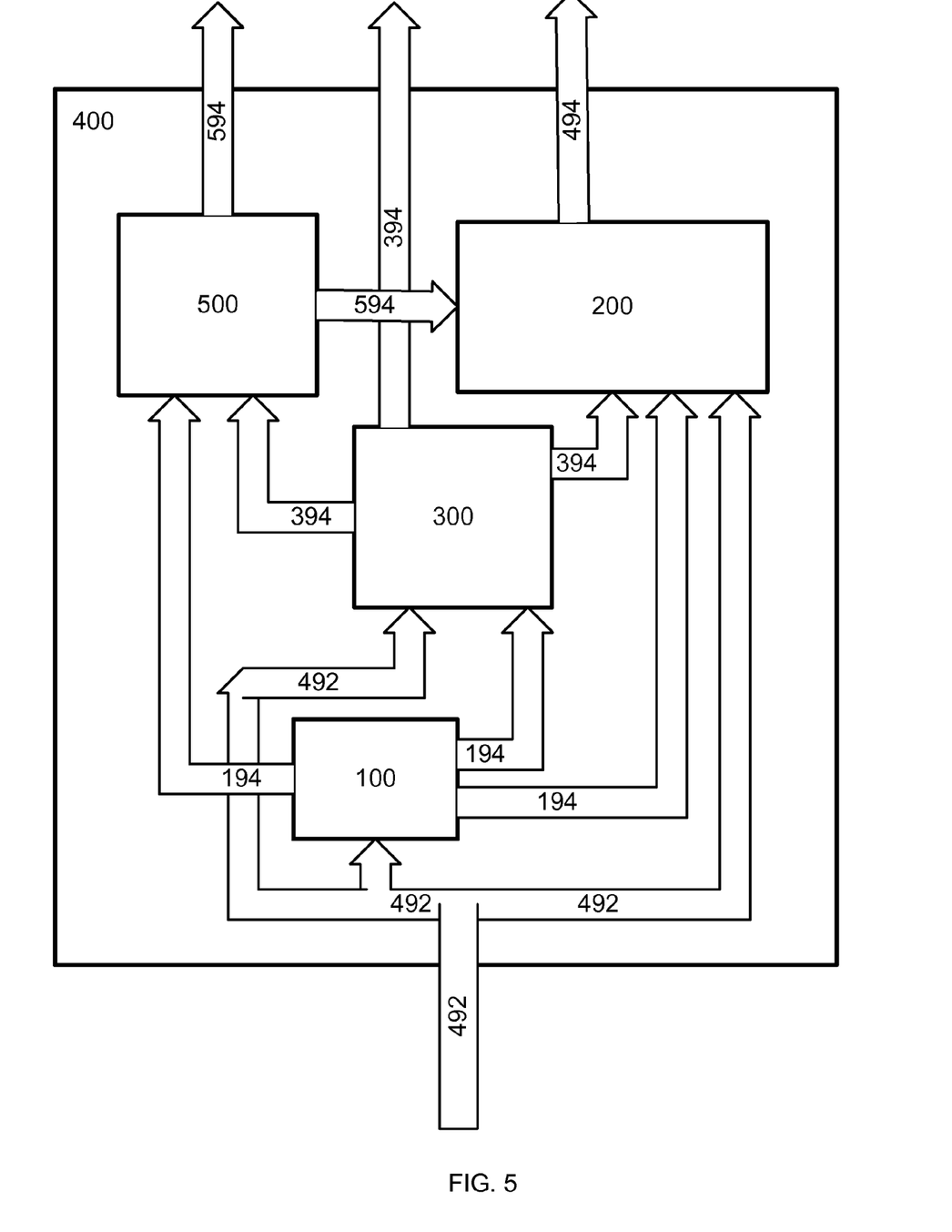
FIG. 5 is a block diagram of an embodiment of a system for providing an output clock signal.

It is clear to a person who is skilled in the art that in embodiments of system 400 that include more than three clock dividers, more complex architectures are possible. FIG. 5 is a block diagram of system 400 for providing output clock signal 494. Conveniently, at least one clock divider of system 400 (such as fourth clock divider 500) is adapted to select fourth divider input clock signal (not shown) out of a group which includes output clock signals of other clock dividers of system 400 (such as first clock divider 100 and third clock divider 300 in the example illustrated in FIG. 5), but that does not include input clock signal 492. In the example illustrated in FIG. 5, fourth clock divider 500 provides fourth divider output clock signal 594 both to second clock divider 200 and to an external system (not shown).

Conveniently, second clock divider 200 is adapted to select second clock input clock signal 292 in response to a power consumption related parameter. It is noted that, second clock divider 200 can be adapted to select second clock input clock signal 292 in response to second clock input clock signal selection indication, which is received from a user, or from a receiver of the output clock.

As known to a person who is skilled in the art, a power consumption of clock generation block (such as system 400) that contains numerous dividers is significant. It is clear to a person who is skilled in the art that a clock divider, which is switched to an alternate lower input frequency, consumes less power. Conveniently, the power consumption decreases proportionally to the ratio between the original frequency (of input clock signal 492 in the above embodiments of the invention) and the reduced frequency (of second divider input clock signal 292 for second clock divider 200 in the above embodiments of the invention).

Referring now back to FIG. 2, it is noted that conveniently, the selection of second divider input clock signal 292 is carried out automatically, in a transparent fashion to a user of system 400 or to another system/component that requests output clock signal 494 of the reduced frequency. It is however clear to a person skilled in the art that the selection of second divider input clock signal 292 could also be carried out manually.

Figure 6:
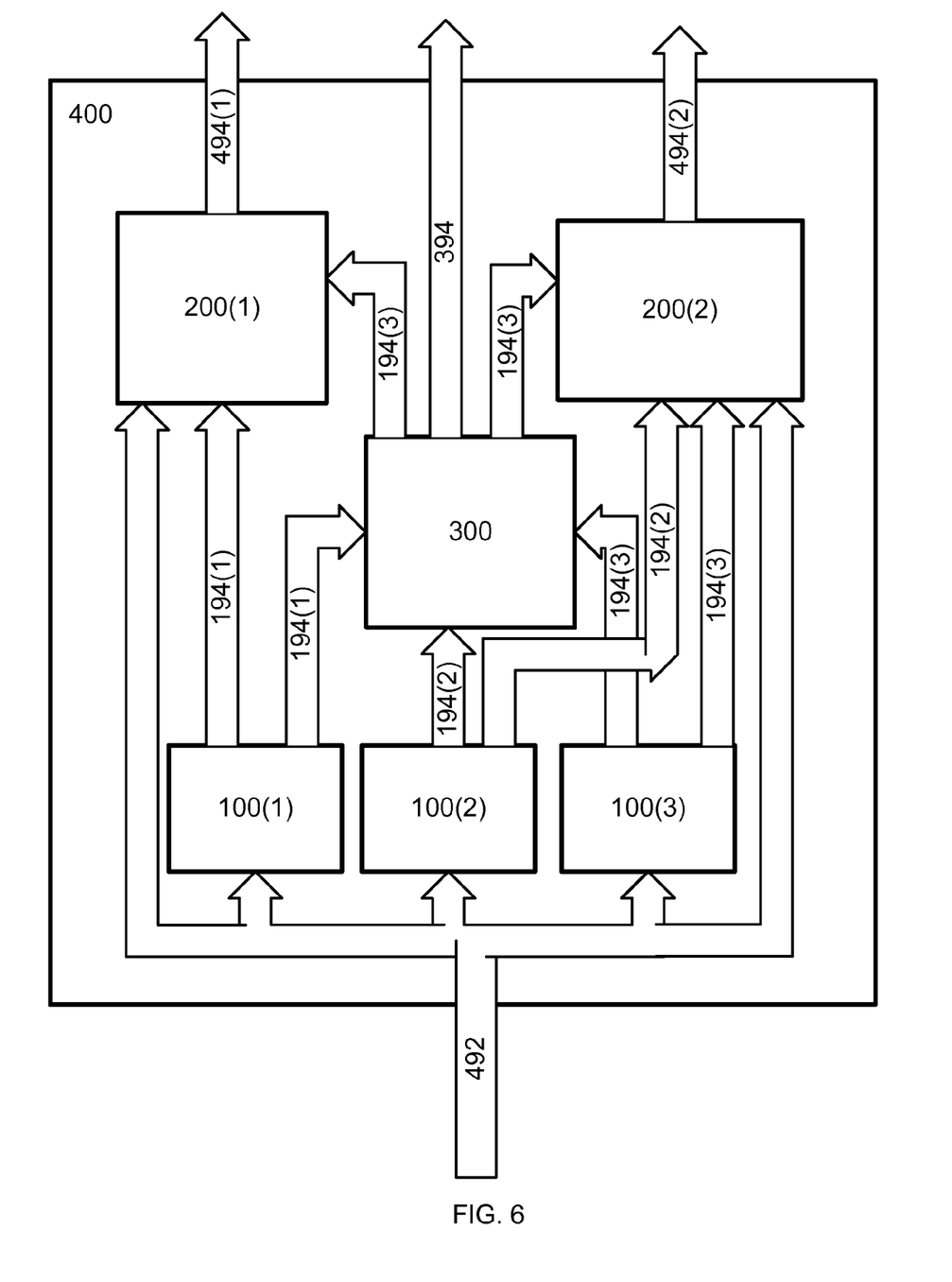
FIG. 6 is a block diagram of an embodiment of a system for providing multiple output clock signals.

FIG. 6 is a block diagram of system 400 for providing multiple output clock signals. Conveniently, system 400 includes multiple global common pre-dividers (such as multiple first clock dividers 100), wherein system 400 is adapted to determine the output frequencies of the multiple first divider output clock signals 194 so as to support multiple dependant clock dividers (such as clock dividers 200, 300, and 500, in the illustrated examples), according to requested division factors or requested input frequencies of said dependant clock dividers. Conveniently, in such an embodiment of the invention, system 400 is adapted to determine the output frequencies in response to a power consumption related parameter. According to different embodiments of the invention, such global common pre-dividers can be enabled automatically, per request of each functional divider, according to required division factor, and so forth.

Conveniently, system 400 is adapted to optimize a determination of multiple division factors of multiple clock dividers (such as first clock dividers 100, second clock dividers 200, etc.), wherein conveniently the optimizing includes determining provision paths, each of which pertains to the provision of an output clock signal from one clock divider to another clock divider.

It is noted that, according to different embodiments of the invention, the optimization of the determination of multiple division factors of multiple clock dividers can be carried in at least one of different optimization ways, e.g. automatically by a hardware controller, automatically by a software controller, and manually, by user configuration.

Figure 7:
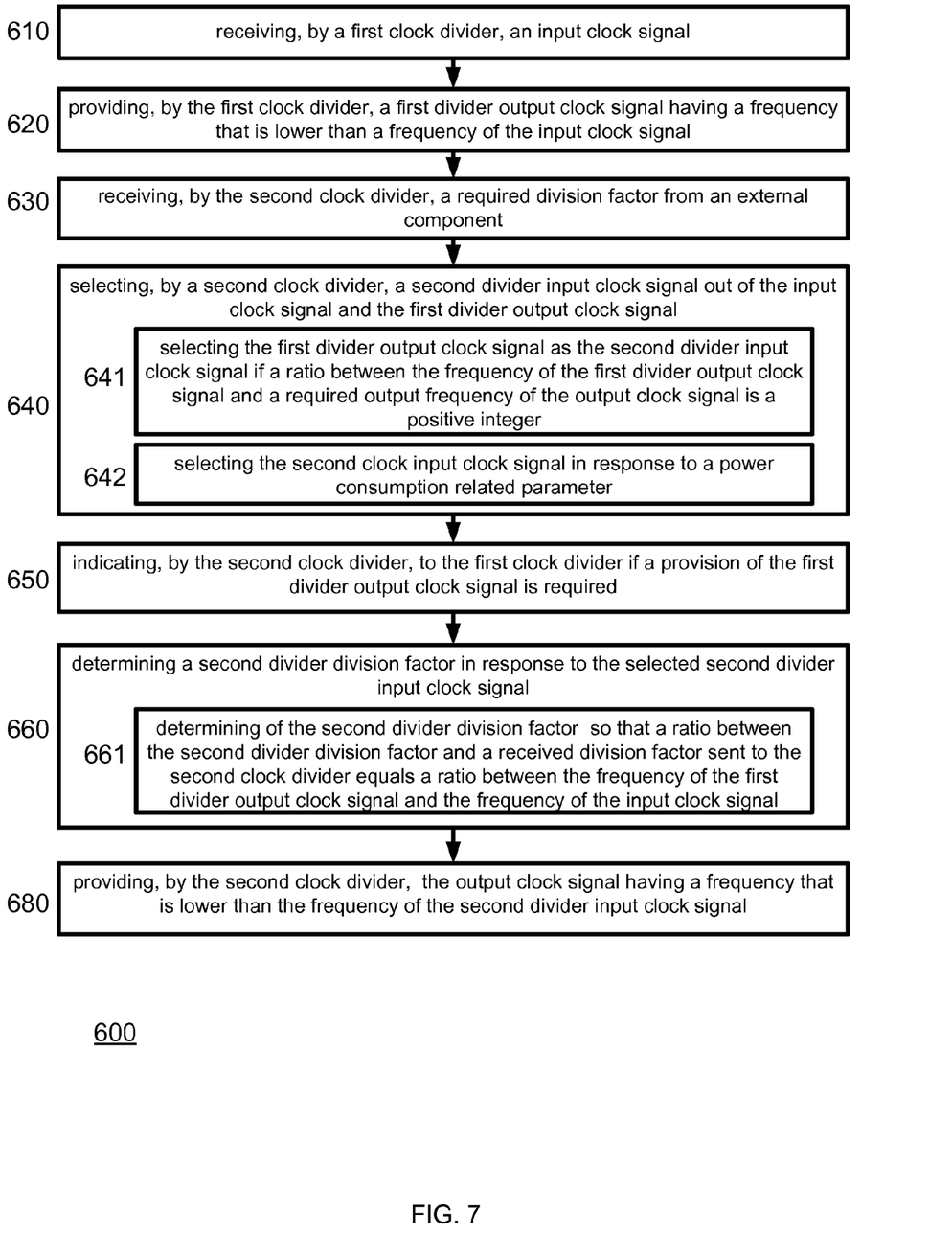
FIG. 7 illustrate an embodiment of a method for providing an output clock signal.

FIG. 7 illustrate method 600 for providing an output clock signal. Method 600 starts with stage 610 of receiving, by a first clock divider, an input clock signal. Referring to the examples set forth in the previous drawings, the first clock divider is conveniently first clock divider 100, and the input clock signal is conveniently input clock signal 492. Referring to the example set forth in FIG. 2, the frequency of input clock signal 492 is denoted as $f_{IN}$.

Stage 610 is followed by stage 620 of providing, by the first clock divider, a first divider output clock signal having a frequency that is lower than a frequency of the input clock signal. Referring to the examples set forth in the previous drawings, the first divider output clock signal is conveniently first divider output clock signal 194. Referring to the example set forth in FIG. 2, first clock divider 100 divides input clock signal 492 to provide first divider output clock signal 192, the frequency of which is half of the frequency of input clock signal 492 (denoted $f_{IN}/2$).

Conveniently, method 600 further includes stage 630 of receiving, by the second clock divider, a required division factor from an external component, wherein the required division factor indicates to the second clock divider the ratio between the required output frequency and the input frequency of the input clock signal. It is noted that, conveniently, the receiving of the required division factor carried out by a division manager of second clock divider 200, which conveniently includes a register for storing the required division factor.

It is noted that, according to another embodiment of the invention, the receiving of stage 630 is a receiving, by the second clock divider, of the required output frequency directly. It is however clear to any person who is skilled in the art that the two are equivalent.

Method 600 continues with stage 640 of selecting, by a second clock divider, a second divider input clock signal out of the input clock signal and the first divider output clock signal. Referring to the examples set forth in the previous drawings, the second clock divider is conveniently second clock divider 200, and the second divider input clock signal is conveniently second divider input clock signal 292. Referring to the example set forth in FIG. 2, second clock divider 200 selects second divider input clock signal 292 out of the input clock signal 492 which has frequency of $f_{IN}$, and of first divider output clock signal 194, which has frequency of $f_{IN}/2$.

It is noted that conveniently, the selection of the second divider input clock signal (and of other clock divider input clock signals, as described below) is carried out automatically, in a transparent fashion to a user or to another system/component which requests the output clock signal of the reduced frequency.

It is noted that, conveniently, stage 640 includes providing, by a multiplexer of the second clock divider that receives both the input clock signal and the first divider output clock signal, the selected second divider input clock signal to a second divider clock division logic of the second clock divider. It is noted that conveniently, the providing by the multiplexer is carried out in response to a selection indication. It is noted that conveniently, the selection indication is provided to the multiplexer by a division manager of the second clock divider.

Referring to the example set forth in FIG. 2, stage 640 includes selecting first divider output clock signal 194 for second divider input clock signal 292, which is used in the dividing of the second divider input clock signal for providing output clock signal 494 of the frequency of $f_{IN}/4$. It is clear to any person who is skilled in the art that other frequencies of the different clock signals could be used, and that the above given values were merely example values which were used to clarify an aspect of the invention.

Conveniently, stage 640 includes stage 641 of selecting the first divider output clock signal as the second divider input clock signal if a ratio between the frequency of the first divider output clock signal and a required output frequency of the output clock signal is a positive integer (or a multiplicative inverse thereof). Conveniently, stage 641 includes selecting the first divider output clock signal as second divider input clock signal if said ratio is a power of 2.

It is known to a person who is skilled in the art that division of a clock signal is relatively easily implemented if a ratio between an input clock signal of the division and an output clock signal thereof is a natural number, and especially, a power of 2, and that divisions of signals by powers of 2 are common in the art. Therefore, situation as described in the example is quite common. Referring again to the example set forth in FIG. 2, as the ratio between the requested output frequency and between the frequency of first signal output clock signal 194 is 1 to 2, the stage 630 conveniently includes selecting first divider output clock signal 194 for second divider input clock signal 292.

Similarly, conveniently, the selecting of stage 641 is responsive to a ratio between the requested division factor and between a first divider division ratio that is used in the dividing of the input clock signal by the first clock divider.

Conveniently, stage 640 includes stage 642 of selecting of the second clock input clock signal is responsive to a power consumption related parameter. As known to a person who is skilled in the art, a power consumption of clock generation block that contains numerous dividers, is significant (by way of example, a typical power consumption for c90LP commercial integrated circuit is around 3 mW). It is clear to a person who is skilled in the art that a clock divider, which is switched to an alternate lower input frequency, consumes less power. Conveniently, the power consumption decreases proportionally to the ratio between the original frequency (of the input clock signal in the above embodiments of the invention) and the reduced frequency (of the second divider input clock signal for the second clock divider in the above embodiments of the invention).

It is noted that, conveniently, the second clock input clock signal is selected in response to second clock input clock signal selection indication, which is received from a user, or from a receiver of the output clock.

Conveniently, method 600 further includes stage 650 of indicating, by the second clock divider, to the first clock divider if a provision of the first divider output clock signal is required. It is noted that the second clock divider require to continuously receive the first divider output clock signal only if the first divider output clock signal is selected for the second divider input clock signal. According to such an embodiment of the invention, method 600 further includes indicating, by the second clock divider, to the first clock divider to provide the first divider output clock signal to the second clock divider only if the first divider output clock signal is selected for the second divider input clock signal. Conveniently, said indication is the selection indication that is provided by the division manager to the first clock divider.

It is however clear to a person who is skilled in the art that the operation of the first clock divider does not have to be dependent upon the indicating of the second clock divider, and that the first clock divider can operate regardless of such indication.

Conveniently, method 600 further includes stage 660 of determining a second divider division factor in response to the selected second divider input clock signal. Conveniently, stage 660 is carried out by the second clock divider, wherein, conveniently, the determining of the second divider division factor is carried out by the division manager. It is noted that, conveniently, a ratio between the second divider division factor and a received division factor sent to the second clock divider (conveniently by a system that requires the output clock signal) equals a ratio between the frequency of the first divider output clock signal and the frequency of the input clock signal.

Conveniently, stage 660 includes stage 661 of determining the second divider division factor so that a ratio between the second divider division factor and the received division factor equals a ratio between the frequency of the first divider output clock signal and the frequency of the input clock signal.

Referring again to the example set forth in relation to FIG. 2, the ratio between the frequencies of the first divider output clock signal and of the input clock signal is 1 to 2. Continuing the same example, the received division factor is 4 (so that the frequency of the output clock signal is $f_{IN}/4$), and therefore determining of stage 660 (which is conveniently carried out by the second clock divider and, according to an aforementioned embodiment of the invention, by the division manager) is determining the second divider division factor to the value of 2, so that the ratio between the second division factor and the received division factor will also equal a 1 to 2 ratio.

Method 600 continues with stage 680 of providing, by the second clock divider, the output clock signal having a frequency that is lower than the frequency of the second divider input clock signal. Continuing the same example set forth in relation to FIG. 2, the second clock divider is provides the output clock signal having a required output frequency that is equal to one fourth of the frequency of the input clock signal (denoted $f_{IN}/4$).

Figure 8:
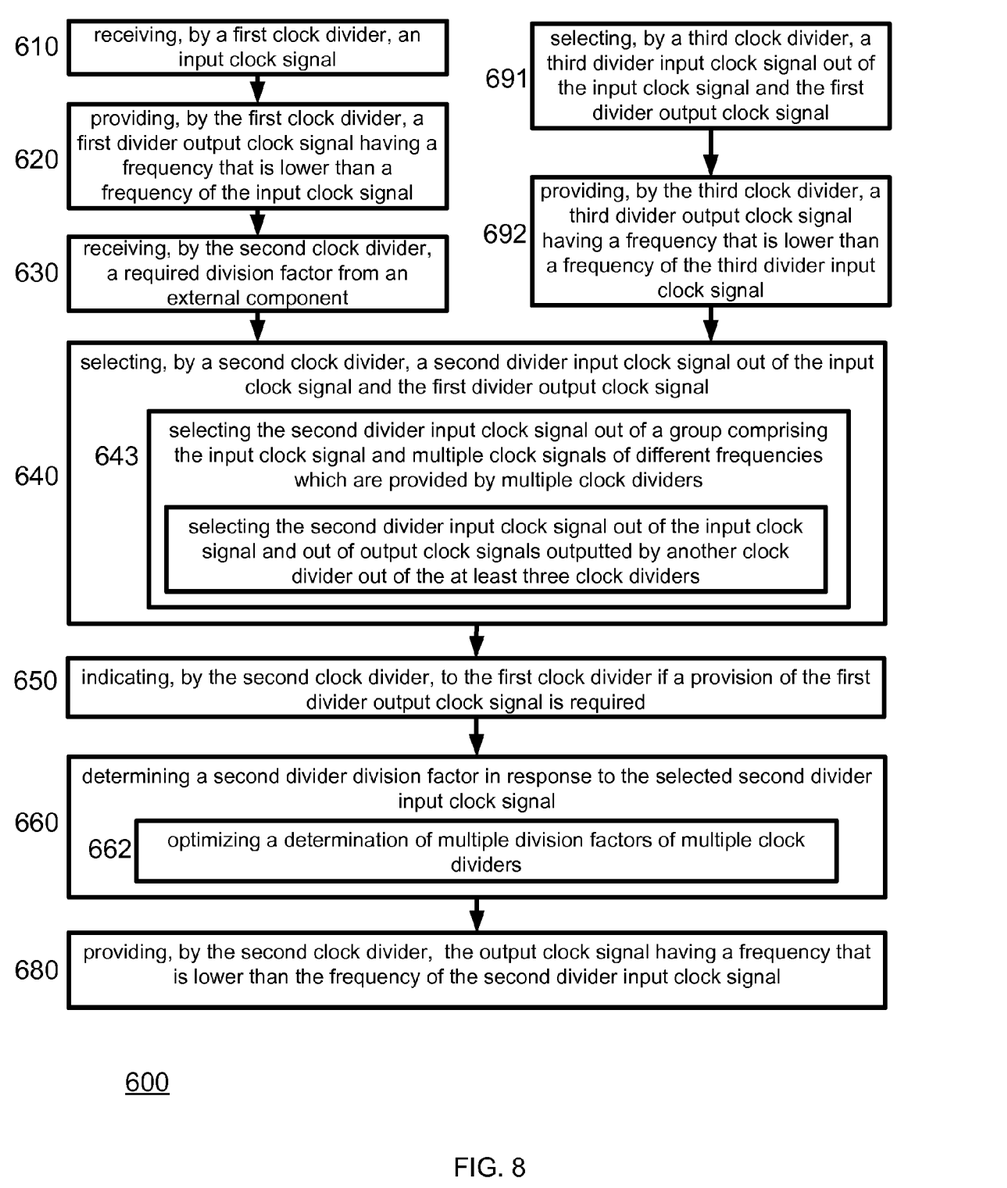
FIG. 8 illustrates an embodiment of a method for providing an output clock signal.

FIG. 8 illustrates method 600 for providing an output clock signal in which the system that carries out method 600 includes at least three clock dividers. It is noted that some stages of method 600 where described in relation to FIG. 7, wherein it is further noted that for convenience of reading FIG. 8, some of the aforementioned stages of method 600 where not illustrated again in FIG. 8.

It will be clear to a person that is skilled in the art that some of the stages which are carried by a clock divider could be carried out by more than one clock dividers of the system that carries out method 600.

Conveniently, method 600 includes stage 691 of selecting, by a third clock divider, a third divider input clock signal out of the input clock signal and the first divider output clock signal, wherein stage 690 conveniently follows receiving, by the third clock divider, the input clock signal and the first divider output clock signal.

Stage 691 is conveniently followed by stage 692 of providing, by the third clock divider, a third divider output clock signal, having a frequency that is lower than the frequency of the third divider input clock signal, wherein the providing of stage 692 conveniently follows a receiving, by the second clock divider, a required division factor from an external component Conveniently, in an embodiment of the invention wherein the system that carries out method 600 includes at least three clock dividers, stage 640 includes stage 643 of selecting the second divider input clock signal out of the input clock signal and out of output clock signals outputted by another clock divider out of the at least three clock dividers (i.e. the first divider output clock signal and the third divider output clock signal, also it is clear to a person who is skilled in the art that additional output clock signal of additional clock dividers are selectable in different embodiments of the invention).

Conveniently, if stages 691 and 692 are implemented, stage 643 includes stage 644 of selecting the second divider input clock signal out of the input clock signal, the first divider output clock signal, and the third divider output clock signal.

Referring to the example set forth in FIG. 4, first clock divider 100 provides first divider output clock signal 194 of a frequency of $f_{IN}/2$, and third clock divider 300 provides third divider output clock signal 394 of a frequency of $f_{IN}/8$. The requested output frequency is $f_{IN}/16$, and the selecting of stage 640 includes selecting, by second clock divider 200, to divide third divider output clock signal 394 to provide output clock signal 494, the frequency of which is $f_{IN}/16$.

It is noted that conveniently, the selecting of stage 640 (that is carried out by one or more clock dividers of the system that carries out method 600) includes selecting as an input clock signal the received signal of the relevant clock divider having the lowest frequency, which qualifies with selection rules which relate to ratios between the frequency of a requested output frequency requested from said clock divider and the frequencies of the multiple input clock signals received by said clock divider. It will be clear to a person who is skilled in the art that conveniently, such a selecting facilitates lower power consumption by said clock divider, and thus by the system generally.

It is noted that, typically, power consumption reduction is achieved at least in two types of systems: (a) as is disclosed above, the system including the clock dividers may include according to different embodiments of the invention multiple first clock dividers and/or multiple second clock dividers, wherein power consumption reduction is conveniently achieved in systems which includes more second clock dividers than first clock dividers (e.g. a single first clock divider is serving multiple second clock dividers); (b) in systems where the first clock divider is already incorporated in the system, and the second clock divider is added on top of the already existing first clock divider, and uses the later so as to reduce power consumption of the subsequently added second clock divider. It is however clear to a person who is skilled in the art that power consumption reduction according to the teachings of the invention may be achieved in other architectures and situations but the two offered above.

It is noted that conveniently, output clock signals generated by clock dividers other than the second clock divider are provided to different systems or components thereof, which demands clock signals in different frequencies.

It is clear to a person who is skilled in the art that in embodiments of the invention in which the system that carries out method 600 includes more than three clock dividers, more complex architectures are possible. Referring to the examples set forth in the previous drawings, FIG. 5 is a block diagram of system 400 for providing output clock signal 494, according to an embodiment of the invention. According to an embodiment of the invention, method 600 includes selecting, by at least one clock divider (such as fourth clock divider 500) a fourth divider input clock signal out of a group which includes output clock signals of other clock dividers the system that carries out method 600 (such as the first clock divider and the third clock divider in the example illustrated in FIG. 5), but that does not include the input clock signal. In the example illustrated in FIG. 5, fourth clock divider 500 provides fourth divider output clock signal 594 both to second clock divider 200 and to an external system (not shown).

Referring to the examples set forth in the previous drawings, FIG. 6 is a block diagram of system 400 for providing multiple output clock signals. Conveniently, the system that carries out method 600 includes multiple global common pre-dividers (such as multiple first clock dividers 100), wherein method 600 includes determining output frequencies of the multiple first divider output clock signals so as to support multiple dependant clock dividers (such as clock dividers 200, 300, and 500, in the illustrated examples), according to requested division factors or requested input frequencies of said dependant clock dividers. Conveniently, in such an embodiment of the invention, the determining of the output frequencies is responsive to a power consumption related parameter. According to different embodiments of the invention, such global common pre-dividers can be enabled automatically, per request of each functional divider, according to required division factor, and so forth.

Conveniently, method 600 includes stage 652 of optimizing a determination of multiple division factors of multiple clock dividers. Conveniently, the optimizing includes determining provision paths, each of which pertains to the provision of an output clock signal from one clock divider to another clock divider.

It is noted that, according to different embodiments of the invention, the optimization of the determination of multiple division factors of multiple clock dividers can be carried in at least one of different optimization ways, e.g. automatically by a hardware controller, automatically by a software controller, and manually, by user configuration.

The present invention can be practiced by employing conventional tools, methodology, and components. Accordingly, the details of such tools, component, and methodology are not set forth herein in details. In the previous descriptions, numerous specific details are set forth, in order to provide a thorough understanding of the present invention. However, it should be recognized that the present invention might be practiced without resorting to the details specifically set forth.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A system for providing an output clock signal, the system comprises:
   a first clock divider, adapted to receive an input clock signal and to frequency divide the input clock signal to provide a first divider output clock signal having a frequency that is lower than a frequency of the input clock signal;
   a second clock divider, adapted to select a second divider input clock signal out of the input clock signal and the first divider output clock signal, and to frequency divide the second divider input clock signal to provide the output clock signal having a frequency that is lower than the frequency of the second divider input clock signal, wherein the second clock driver is further adapted to select the second divider input clock signal out of a group comprising the input clock signal and multiple clock signals of different frequencies which are provided by multiple clock dividers; and
   a third clock divider, adapted to receive a third divider input clock signal and to frequency divide the third divider input clock signal to provide a third divider output signal having a frequency that is lower than the frequency of the third divider input clock signal, wherein the selecting of the second divider input clock signal comprises selecting the second divider input clock signal out of the input clock signal, the first divider output clock signal and the third divider output clock signal;
   wherein multiple clock dividers out of the first, second and third clock dividers are prevented from concurrently selecting the input clock signal and frequency dividing the input clock signal.

2. The system according to claim 1, wherein the second clock divider is further adapted to determine a second divider division factor in response to the selected second divider input clock signal.

3. The system according to claim 2, wherein a ratio between the second divider division factor and a received division factor sent to the second clock divider equals a ratio between the frequency of the first divider output clock signal and the frequency of the input clock signal.

4. The system according to claim 1, wherein the second clock divider is adapted to indicate to the first clock divider if a provision of the first divider output clock signal is required.

5. The system according to claim 1, wherein the second clock divider is adapted to select the first divider output clock signal as the second divider input clock signal if a ratio between the frequency of the first divider output clock signal and a required output frequency of the output clock signal is a positive integer.

6. The system according to claim 1, comprising at least three clock dividers, wherein the second clock divider is adapted to select the second divider input clock signal out of the input clock signal and out of output clock signals outputted by another clock divider out of the at least three clock dividers.

7. The system according to claim 1, wherein the second clock divider is adapted to select the second divider input clock signal in response to a power consumption related parameter.

8. The system according to claim 1, further adapted to optimize a determination of multiple division factors of multiple clock dividers.

9. A method for providing an output clock signal, the method comprises:
   (a) receiving, by a first clock divider, an input clock signal;
   (b) providing, by the first clock divider and by frequency division, a first divider output clock signal having a frequency that is lower than a frequency of the input clock signal;
  (c) selecting, by a second clock divider, a second divider input clock signal out of the input clock signal and the first divider output clock signal, wherein the selecting comprises selecting the second divider input clock signal out of a group comprising the input clock signal and multiple clock signals of different frequencies which are provided by multiple clock dividers;
  (d) providing, by the second clock divider and by frequency division, the output clock signal having a frequency that is lower than the frequency of the second divider input clock signal;
  (e) selecting, by a third clock divider, a third divider input clock signal out of the input clock signal and the first divider output clock signal;
  (f) providing, by the third clock divider and by frequency division, a third divider output clock signal having a frequency that is lower than the frequency of the third divider input clock signal; wherein the selecting of the second divider input clock signal comprises selecting the second divider input clock signal out of the input clock signal, the first divider output clock signal and the third divider output clock signal;
wherein multiple clock dividers out of the first, second and third clock dividers are prevented from concurrently selecting the input clock signal and frequency dividing the input clock signal.

10. The method according to claim 9, further comprising determining a second divider division factor in response to the selected second divider input clock signal.

11. The method according to claim 10, wherein the determining of the second divider division factor comprises determining the second divider division factor so that a ratio between the second divider division factor and a received division factor sent to the second clock divider equals a ratio between the frequency of the first divider output clock signal and the frequency of the input clock signal.

12. The method according to claim 9, further comprising indicating, by the second clock divider, to the first clock divider if a provision of the first divider output clock signal is required.

13. The method according to claim 9, wherein the selecting comprises selecting the first divider output clock signal as the second divider input clock signal if a ratio between the frequency of the first divider output clock signal and a required output frequency of the output clock signal is a positive integer.

14. The method according to claim 9, wherein the selecting of the second divider input clock signal is responsive to a power consumption related parameter.

15. The method according to claim 9, further comprising optimizing a determination of multiple division factors of multiple clock dividers.

* * * * *